United States Patent

Sato

Patent Number: 5,774,205
Date of Patent: Jun. 30, 1998

[54] EXPOSURE AND METHOD WHICH TESTS OPTICAL CHARACTERISTICS OF OPTICAL ELEMENTS IN A PROJECTION LENS SYSTEM PRIOR TO EXPOSURE

[75] Inventor: Ryuichi Sato, Utsunomiya, Japan

[73] Assignee: Canon Kabushiki Kaisha, Tokyo, Japan

[21] Appl. No.: 682,959

[22] Filed: Jul. 18, 1996

[30] Foreign Application Priority Data

Jul. 21, 1995 [JP] Japan .................................... 7-207700

[51] Int. Cl.$^6$ .......................... G03B 27/54; G03B 27/42; G03B 27/52; G01B 11/00
[52] U.S. Cl. .............................. 355/67; 355/53; 355/55; 355/68; 356/399; 356/400; 356/401
[58] Field of Search ..................................... 356/399, 400, 356/401, 124, 124.5; 250/548; 355/53, 55, 67; 359/581, 601

[56] References Cited

U.S. PATENT DOCUMENTS

| | | | |
|---|---|---|---|
| 4,629,313 | 12/1986 | Tanimoto | 355/53 O |
| 4,938,598 | 7/1990 | Akiyama et al. | 250/548 X |
| 5,138,176 | 8/1992 | Nishi | 250/548 O |
| 5,381,210 | 1/1995 | Hagiwara | 355/53 O |
| 5,534,970 | 7/1996 | Nakashima et al. | 355/53 O |
| 5,614,990 | 3/1997 | Bruce et al. | 355/53 X |

FOREIGN PATENT DOCUMENTS

51-42495   4/1976   Japan .

*Primary Examiner*—R. L. Moses
*Assistant Examiner*—Shival Virmani
*Attorney, Agent, or Firm*—Fitzpatrick, Cella, Harper & Scinto

[57] ABSTRACT

An exposure apparatus for and a method of producing devices, in which an original pattern such as a reticle is projected onto an object such as a wafer to be exposed, through a projection optical system. The projection optical system includes at least one optical element, optical characteristics thereof having been tested using a measuring beam having a first wavelength region. An exposure light source emits a light beam having a second wavelength region, selected independently from the first wavelength region, to irradiate the original pattern with the beam from the exposure light source, so that an image of the pattern is projected onto the object through the projection optical system, thereby exposing the object to produce the device.

23 Claims, 4 Drawing Sheets

EXPOSURE AND METHOD WHICH TESTS OPTICAL CHARACTERISTICS OF OPTICAL ELEMENTS IN A PROJECTION LENS SYSTEM PRIOR TO EXPOSURE

BACKGROUND OF THE INVENTION

1. Field of the Invention

This invention relates to an exposure apparatus and a method of producing a device using the same. In particular, the present invention is adapted for producing various devices such as integrated circuits, large-scale integrated circuits, charge-coupled devices, liquid crystal displays, and magnetic heads.

2. Description of the Related Art

Recently, with a higher degree of integration of semiconductor elements, the resolution of a pattern to be exposed is becoming increasingly important. Therefore, it is a requirement that an exposure apparatus has increased performance such that the resolution becomes significantly finer and that alignment precision between a reticle and a wafer becomes more improved, and so forth.

It is known that the resolution is proportional to a wavelength of the light used for exposure. Thus, far ultraviolet light having a shorter wavelength region has been used. The resolution is also dependent upon a numerical aperture of a projection optical system used in the exposure apparatus. Thus, a projection optical system having a greater numerical aperture has been used. Further, chips, as objects to be exposed, have tended to become large. With this trend, a screen of the projection optical system used for exposure has become larger. On the other hand, in an alignment optical system for aligning the mask and wafer, for example, a through-the-lens alignment device has primarily been used for higher precision.

Further, on each surface of the lenses included in the projection optical system, layers are formed, which have low reflectance and high transmittance in a wavelength region of light used for exposure, by which stray light is reduced, image performance is improved and exposure is enhanced, so that throughput of the apparatus is improved.

Also, with respect to a wavelength region of light used for through-the-lens alignment, layers are formed on each surface of the lenses included in the projection optical system, which layers have low reflectance and high transmittance, for reducing stray light with respect to an alignment position detection system, and enhancing the amount of detection light, whereby alignment precision is improved.

With such improved performance, it is a requirement to minimize production tolerances of the projection optical system. Therefore, high precision measurements are essential, by using an interferometer, such as measurement of a surface shape, decentering of the projection lens, and so on. Recently, in order to increase this measurement precision, a laser having a shorter wavelength has tended to be used as a light source for the interferometer.

As described above, layers having low reflectance and high transmittance are provided in the projection optical system of the exposure apparatus, in order to decrease reflectance and increase transmittance in both the exposure wavelength region and the wavelength region for through-the-lens alignment. Consequently, it is desired that the reflectance be extremely low, normally not more than 1.0%, on each surface of the lenses included in the projection optical system, in both the exposure wavelength region and the wavelength region for through-the-lens alignment.

On the other hand, inspection and adjustment steps, using rays reflected from the respective lens surfaces included in the projection optical system, are utilized in a process for producing the projection optical system. In these steps, for example, in order to maintain the surface shape and decentering of the lens within a desired tolerance, measurement is performed with an interferometer utilizing a ray reflected from the lens surface as a measuring beam. In this measurement, it is desired that the reflectance be normally not less than 2%. Accordingly, when the wavelength region of the measuring beam used in the interferometer is almost equal to the exposure wavelength region or the wavelength region for through-the-lens alignment, a problem arises in that the interferometer is not sufficiently supplied with rays reflected from the lens surface, resulting in insufficient measurement precision.

SUMMARY OF THE INVENTION

Object of the Invention

It is an object of the present invention to provide an exposure apparatus that is capable of readily producing highly integrated devices, and a method of producing a device using the apparatus, by forming layers having appropriate spectral characteristics on optical elements included in a projection optical system for projecting a pattern on a reticle onto a wafer, whereby exposure of the wafer, alignment of the reticle and the wafer, measurement of interference, and so forth are preferably performed.

Brief Summary of the Invention

To achieve the above and other objects, in accordance with the present invention, there is provided an exposure apparatus for producing a device, in which an original pattern such as a reticle is projected onto an object such as a wafer to be exposed, through a projection optical system, the exposure apparatus comprising at least one optical element included in the projection optical system, the optical characteristics of each of the optical elements having been tested using a measuring beam having a first wavelength region, and an exposure light source for emitting a light beam, having a second wavelength region selected independently of the first wavelength region, to irradiate the original pattern, so that an image of the pattern is projected onto the object through the at least one optical element, thereby exposing the object to produce the device.

The exposure apparatus further comprises an alignment light source for emitting a light beam, having a third wavelength region selected independently of the first wavelength, to irradiate the object with the beam from the alignment light source, wherein a beam returned from the body is detected through the projection optical system, for measuring the position of the body.

The first wavelength region is between the second and the third wavelength regions.

Each of the optical elements is provided with low reflectance layers. The layers have such characteristics that the reflectance of the first wavelength region is higher than that of either of the second or third wavelength region.

The low reflectance layers have such characteristics that the reflectance of the first wavelength region is not less than 2% and the reflectance of either of the second or third wavelength region is not more than 1%.

The second wavelength region is in a range of g-line or a range of i-line, including neighborhoods thereof.

The exposure light source is a krypton-fluorine excimer laser or an argon-fluorine excimer laser.

The third wavelength region is a helium-neon laser wavelength region or a wavelength region in the neighborhood of 610 nm.

The measuring beam has a wavelength region of a laser oscillating at a single frequency.

The laser oscillating at the single frequency is an argon laser or a yttrium-aluminum-garnet-double-wave laser.

In accordance with another aspect of the present invention, there is provided a method of producing a device by projecting an original pattern such as a reticle onto an object such as a wafer to be exposed through a projection optical system having at least one optical element whose optical characteristics have been tested using a measuring beam having a first wavelength region, the method comprising the steps of: projecting an image of the original pattern onto the object by irradiating a light beam having a second wavelength region, discrete from the first wavelength region, onto the original pattern and through the projection optical system, thereby exposing the object; and measuring the position of the object, by irradiating a light beam having a third wavelength region, discrete from the first wavelength region, and detecting a beam returned from the object through the at least one optical element of the projection optical system.

The first wavelength region is between the second and third wavelength regions.

Each of the optical elements is provided with low reflection layers. The layers have such characteristics that the reflectance of the first wavelength region is higher than that of either of the second or third wavelength region.

The low reflectance layers have such characteristics that the reflectance of the first wavelength region is not less than 2% and the reflectance of either of the second or third wavelength region is not more than 1%.

The present invention will be more apparent from a description of the preferred embodiments which is set forth below.

DESCRIPTION OF THE PREFERRED EMBODIMENTS

Figure 1:
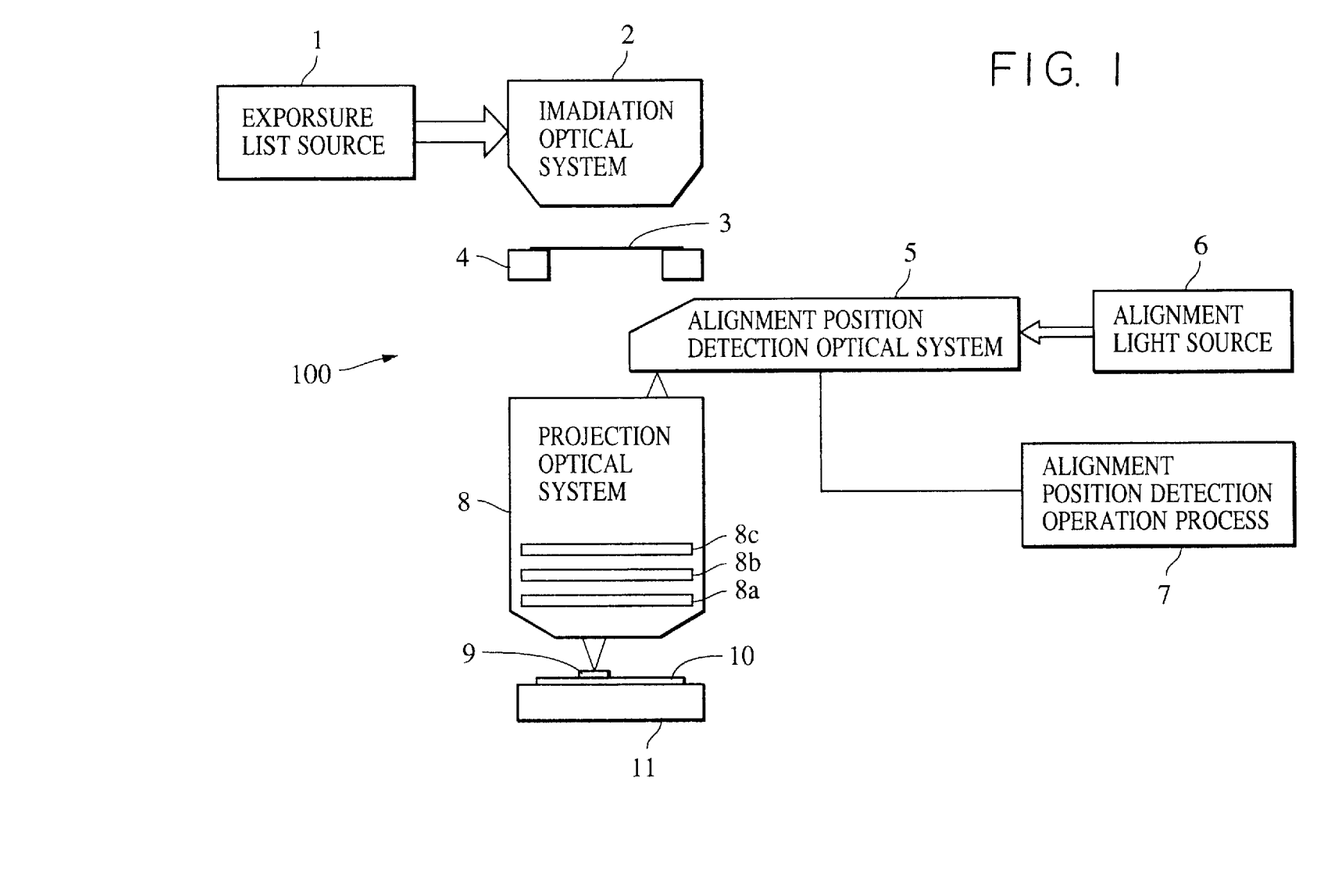
FIG. 1 is a schematic elevational view illustrating an exposure apparatus according to an embodiment of the present invention.

FIG. 1 shows a schematic view of an exposure apparatus 100 for producing a semiconductor device according to the first embodiment of the present invention. The exposure apparatus 100 includes a projection optical system 8, in which layers having low reflectance and high transmittance are formed on each optical element 8a, 8b, 8c, etc. included in the projection optical system 8. In these layers, the reflectance is reduced in both an exposure wavelength region and a wavelength region used for through-the-lens alignment of the apparatus, and the reflectance is increased in wavelength regions used in various kinds of measurements performed in a process of the producing projection optical system.

In the exposure apparatus 100, an exposure light source 1 emits a light beam used as an exposure beam. The beam has a wavelength region selected from the following regions: a wavelength region of g-line (436 nm) emitted by a super-high pressure mercury vapor lamp and wavelengths in the neighborhood thereof; a wavelength region of i-line (365 nm) and wavelengths in the neighborhood thereof; a krypton-fluorine excimer laser wavelength region; and an argon-fluorine excimer laser wavelength region. In this context, the wavelengths in the neighborhood of g-line mean 436±5 nm. The wavelengths in the neighborhood of i-line mean 365±5 nm. The krypton-fluorine excimer laser wavelength region means 248±0.15 nm. The argon-fluorine excimer laser wavelength region means 193±0.25 nm. The exposure beam is converted in shape by an irradiation optical system 2, so that a reticle 3 on a reticle stage 4 is irradiated with the converted rays. As a result, a pattern on the reticle 3 is transferred onto a wafer 10 on a wafer stage 11 by the projection optical system 8. The pattern-transferred wafer is processed in accordance with a general process of producing a semiconductor device, whereby a semiconductor device is produced. As described above, since the projection optical system 8 is provided with optical elements having layers that provide reduced reflectance and increased transmittance in the exposure wavelength region, the optical system 8 has such characteristics that stray light is reduced and overall transmittance is enhanced, whereby the exposure apparatus has improved image performance and provides increased throughput.

A through-the-lens alignment light source 6 emits a light beam having a helium-neon laser wavelength region (633 nm), or a light beam (alignment beam) having a wavelength region in the neighborhood of 610 nm. The beam having a wavelength region in the neighborhood of 610 nm is generated by, for example, passing rays emitted by a halogen lamp through an optical band pass filter capable of transmitting a beam having a wavelength region in the neighborhood of 610 nm.

In this embodiment, the wavelength region in the neighborhood of 610 nm is a wavelength on the order of 610±40 nm in half-value width, for example. The alignment beam passes through both an alignment position detection optical system 5 and the projection optical system 8 to impinge upon an alignment mark 9 on the wafer 10. The alignment beam is reflected from the alignment mark 9. Thereby, the reflected alignment beam is returned to the alignment position detection optical system 5, through the projection optical system 8. The returned beam is processed by an alignment position detection operation processor 7, whereby the alignment position is detected, and alignment between the reticle and wafer can be executed on demand.

As described above, since the projection optical system 8 is provided with optical elements including layers having increased transmittance and reduced reflectance in the wavelength region of through-the-lens alignment, the optical system 8 has such characteristics that stray light is reduced and the overall transmittance is enhanced, which thus enables alignment with high precision.

As further described above, the optical elements of the projection optical system 8 are also provided with layers having such spectral characteristics that the reflectance is maintained sufficiently high in the wavelength regions of measuring beams used in the various kinds of measurements performed in the process of producing the projection optical system. Thereby, a reflected beam required for the measurement is readily generated to enable inspection and adjustment with high precision, and production of projection optical systems with high performance. In more detail, it is desired that in both the exposure wavelength region and the wavelength region of through-the-lens alignment, the reflectance is not more than 1%, and in the wavelength region of the measuring beam testing the optical characteristics of the optical elements of the projection lens, the reflectance is not less than 2.0%.

Figure 2:
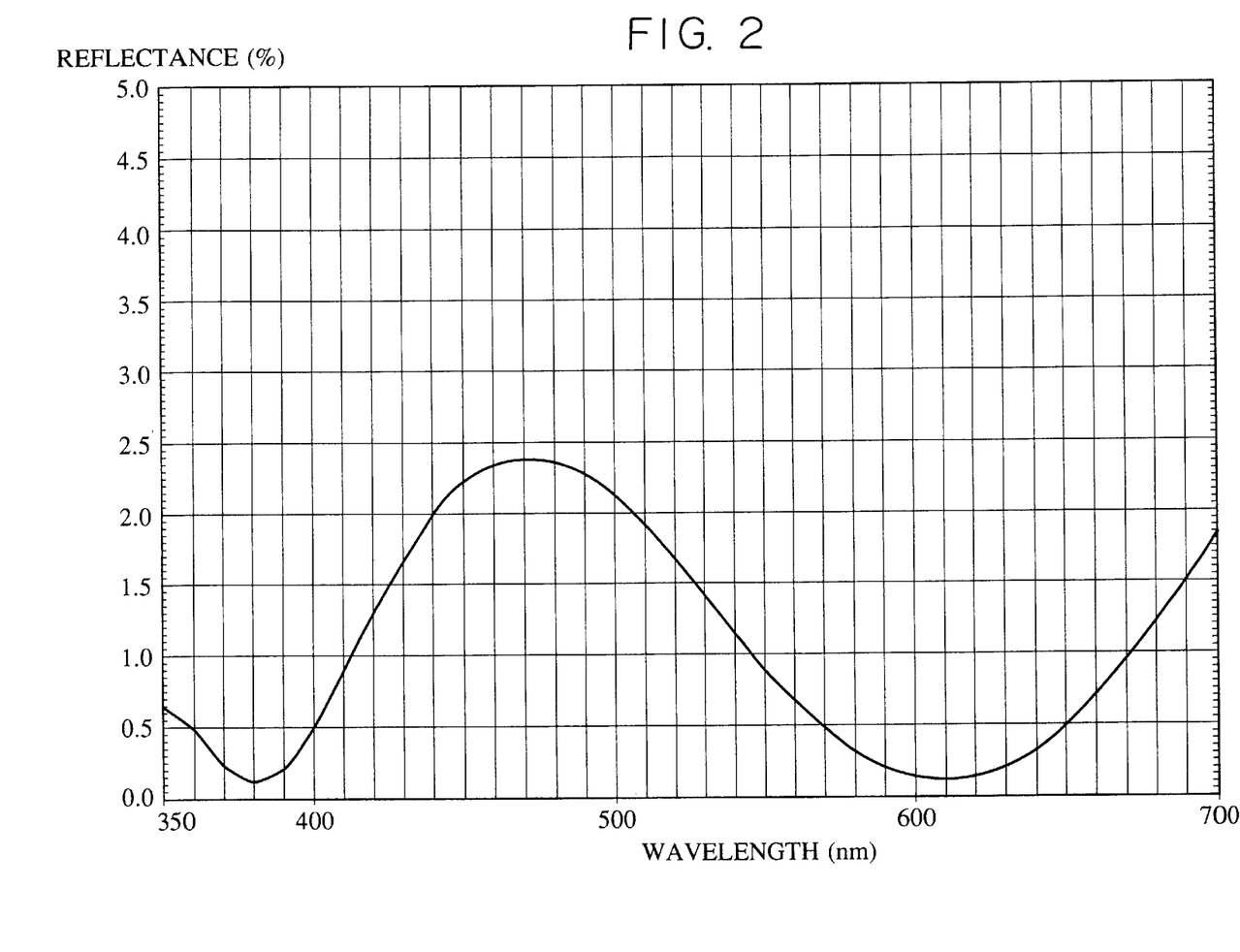
FIG. 2 is a graph showing a relation between reflectance and wavelengths in layers of low reflectance and high transmittance, in a projection optical system in the exposure apparatus of the present invention.

In the following Table 1, there is shown an example of the layers having low reflectance and high transmittance, provided on the optical elements in the projection optical system 8. In connection with this example, the reflectance is shown in FIG. 2.

TABLE 1

| LAYER | MATERIAL | nd(nm) |
|---|---|---|
| 1 | Mixture of $ZrO_2$ and $TiO_2$ (Molar ratio of 6:1) | 28.24 |
| 2 | $Al_2O_3$ | 28.24 |
| 3 | Mixture of $ZrO_2$ and $TiO_2$ (Molar ratio of 6:1) | 115.78 |
| 4 | $Al_2O_3$ | 33.89 |
| 5 | Mixture of $ZrO_2$ and $TiO_2$ (Molar ratio of 6:1) | 45.18 |
| 6 | $MgFZ_2$ | 115.78 |

In this example, i-line (365 nm) is used as the exposure wavelength region, a helium-neon laser (633 nm) wavelength region or 610±40 nm is used as the wavelength region of through-the-lens alignment, and an argon laser whose oscillation frequency is 455 nm, 477 nm, 488 nm, or 497 nm, is used as the wavelength of the measuring beam in the process of producing the projection optical system.

As shown in FIG. 2, in both the exposure wavelength region and the wavelength region of through-the-lens alignment, the reflectance is not more than 0.5%, while in the wavelength region of the measuring beam used in the process of producing the projection optical system, the reflectance is not less than 2%, thus desired reflectance is realized in each instance. Further, it is also possible in this embodiment, by changing the materials or configuration of the layers, to realize desired reflectance in the other wavelength regions.

As can be seen in this embodiment, the exposure wavelength region or the wavelength region of through-the-lens alignment, and the wavelength region of the measuring beam in the process of producing the projection optical system are considered to be independent from each other, whereby the layers of low reflectance and high transmittance provided on the optical elements of the projection optical system have such spectral characteristics that the reflectance is reduced in both the exposure wavelength region and the wavelength region of through-the-lens alignment, and the reflectance is increased in the wavelength region of the measuring beam.

Such a design enables the projection optical system to have, in the exposure wavelength region, reduced stray light and increased transmittance overall, which thus provides an exposure apparatus having improved image performance and an increased throughput. On the other hand, the projection optical system also has reduced stray light and increased transmittance overall in the wavelength region of through-the-lens alignment, which enables high precision alignment.

Further, the reflectance is increased in the wavelength region of a light beam from the light source used in the process of producing the projection optical system. Thus, a strong reflected beam required for production measurements is generated to enable inspection and adjustment with high precision and production of projection optical systems with high performance.

As can be seen from the foregoing, the present invention provides a high performance exposure apparatus whose optical performance is significantly improved.

Figure 3:
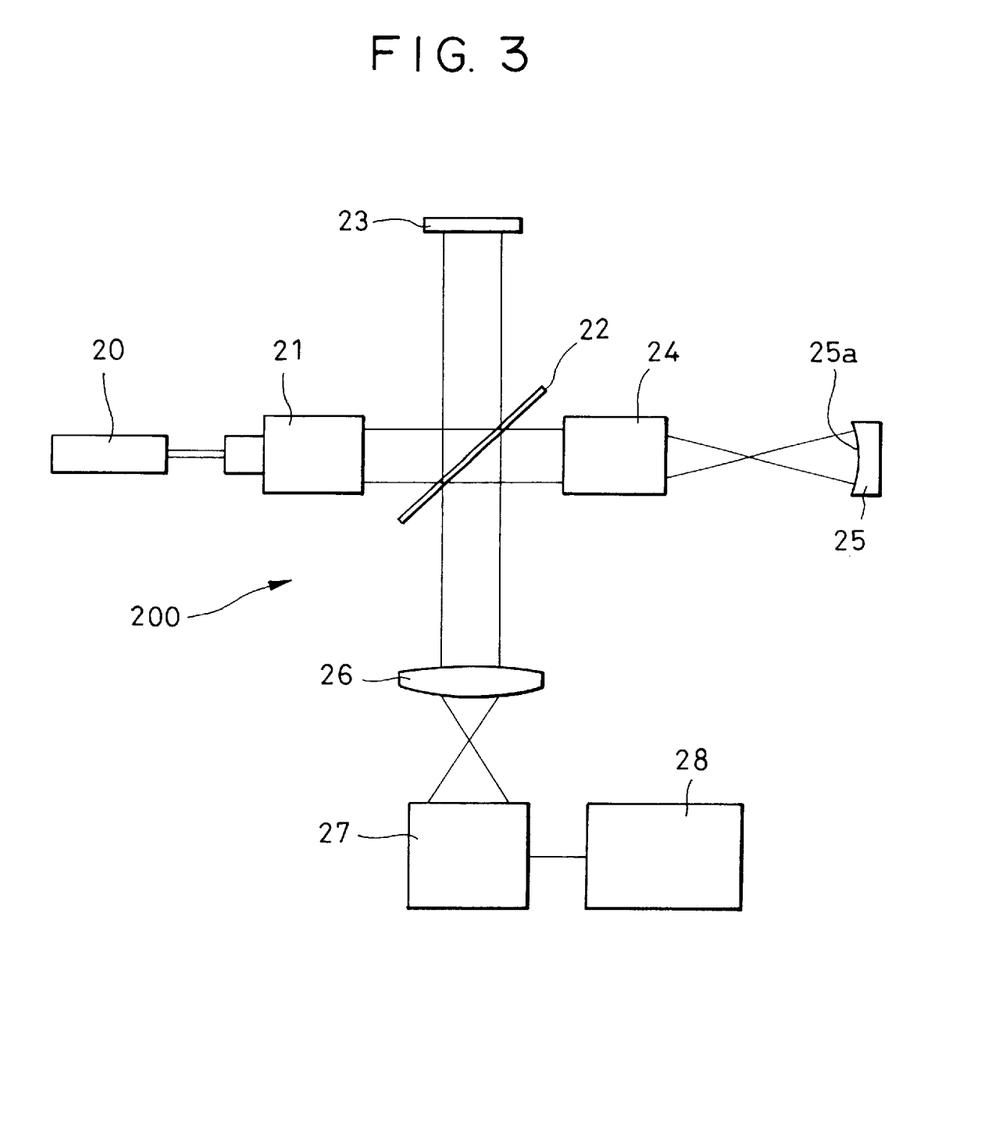
FIG. 3 is a schematic elevational view illustrating an embodiment for performing measurements in a process of producing the projection optical system in the exposure apparatus of the present invention.

FIG. 3 shows an embodiment for measuring the optical characteristics of the optical elements in the process of producing the projection optical system. This embodiment includes a Michelson interferometer 200 for measuring the surface shape of a lens included in the projection optical system. The interferometer 200 includes a single frequency laser 20, a beam expander 21, a half mirror 22, a reference mirror 23, a collimator 24, a lens to be tested 25, an image formation lens 26, a camera 27, and an image processor 28. The surface 25a of the lens is measured by the interferometer. The lens surface 25a is provided with such layers that the reflectance is not low in the wavelength region of the single frequency laser 20. Therefore, a light beam of sufficient strength is generated to enable high precision measurement of the surface of the lens.

When the lens surface 25a has a reflectance as shown in FIG. 2, for example, an argon laser whose oscillating frequency is 458 nm is used as the single frequency laser 20. Also, it is possible to use an argon laser whose oscillating frequency is 477 nm, 488 nm, or 497 nm. Further, depending upon the characteristics (as shown in Japanese Patent Publication No. 51-42495) of the reflection layers on the lens surface 25a, it is possible to use, as the laser 20, an argon laser whose oscillating frequency is 515 nm or 529 nm, or an yttrium-aluminum-garnet-double-wave laser whose oscillating frequency is 532 nm, and so forth.

Figure 4:
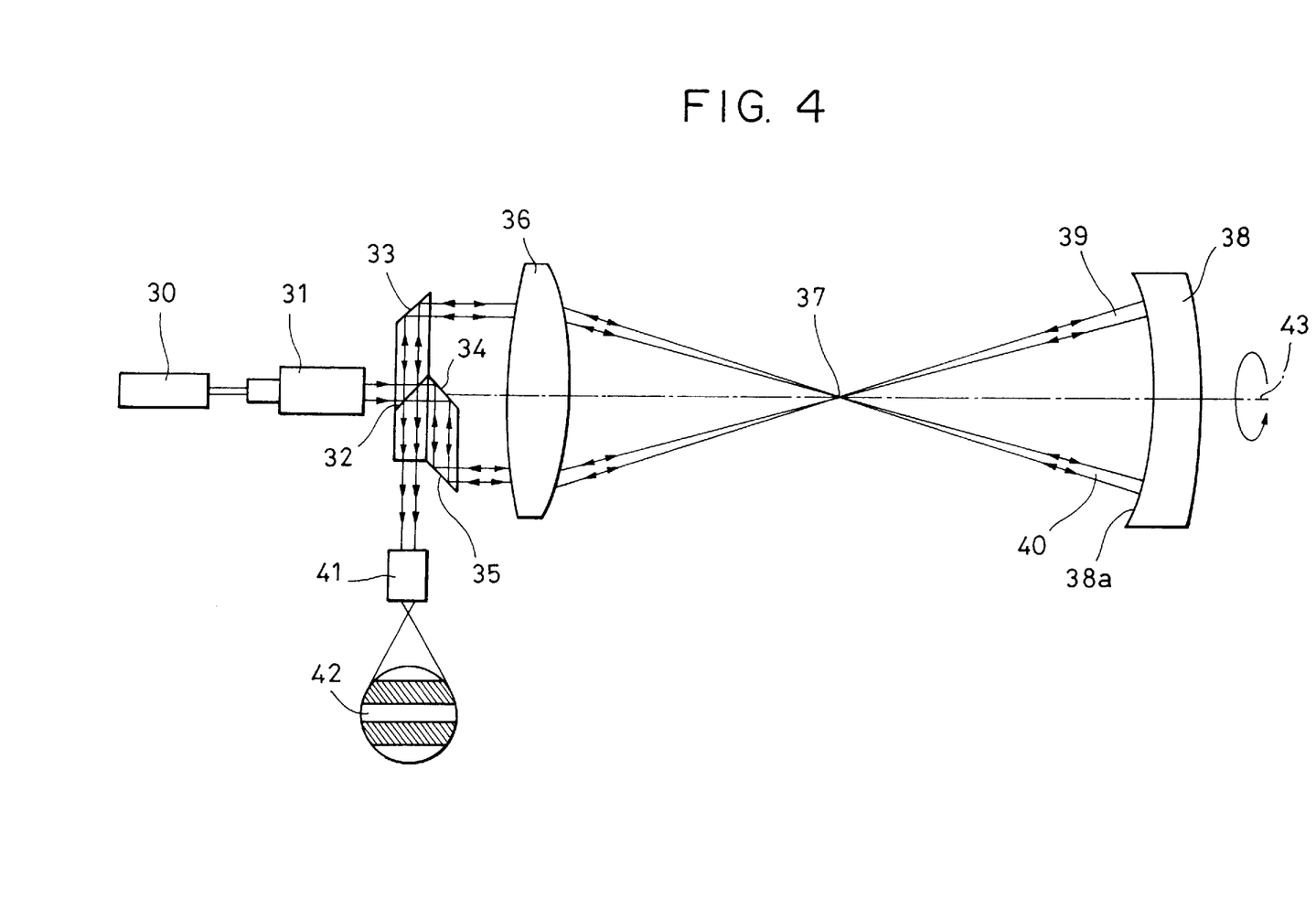
FIG. 4 is a schematic elevational view illustrating an embodiment for performing measurements in the process of producing the projection optical system in the exposure apparatus of the present invention.

FIG. 4 shows another embodiment for measuring the optical characteristics of the optical elements in the process of producing the projection optical system, namely, an example of a measurement of decentering as disclosed in Japanese Patent Publication No. 51-42495, using a configuration of a single frequency laser 30, a beam expander 31, a beam splitter 32 forming a beam separation optical system, total reflection mirrors 33, 34, and 35, a lens 36, having an axis of rotation 43, and a lens 41. This example shows the measurement of decentering, of a surface 38a of a lens 38 to be tested, from the axis of rotation 43. The lens surface 38a is provided with layers having such spectral characteristics that increase the transmittance. Therefore, a light beam of sufficient strength is generated to enable high precision measurement of the surface shape.

FIG. 4 further shows two beams 39 and 40 separated by the beam separation optical system 32, and interference fringes 42 caused by the beams 39 and 40, which are magnified by the lens 41.

When the surface 38a has a reflectance as shown in FIG. 2, for example, an argon laser whose oscillating frequency is 458 nm is used as the single frequency laser 30. Also, it is possible to use an argon laser whose oscillating frequency is 477 nm, 488 nm, or 497 nm. Further, depending upon the characteristics of the reflection layers on the surface 38a it is possible to use, as the laser 30, an argon laser whose oscillating frequency is 515 nm or 529 nm, or an yttrium-aluminum-garnet-double-wave laser whose oscillating frequency is 532 nm, and so forth.

Except as otherwise disclosed herein, the various components shown in outline or in block form in the Figures are individually well known and their internal construction and operation are not critical either to the making or using this invention or to a description of the best mode of the invention.

While the present invention has been described with respect to what is at present considered to be the preferred embodiment, it is to be understood that the invention is not limited the disclosed embodiments. To the contrary, the invention is intended to cover various modifications and equivalent arrangements included within the spirit and scope of the appended claims. The scope of the present invention is to be accorded the broadest interpretation so as to encompass all such modifications and equivalent structures and functions.

What is claimed is:

1. An exposure apparatus for producing devices, in which an original pattern is projected onto an object to be exposed, through a projection optical system, said exposure apparatus comprising:

at least one optical element included in said projection optical system, the optical characteristics of each of the optical elements having been tested using a measuring beam having a first wavelength region, the optical elements having lower reflectance in a second wavelength region, selected independently of the first wavelength region, lower than in the first wavelength region; and an exposure light source for emitting a light beam, having the second wavelength region, to irradiate the original pattern with the beam from said exposure light source, so that an image pattern is projected onto the object, through the at least one optical element, thereby exposing the object to produce the device.

2. An exposure apparatus according to claim 1, further comprising an alignment light source for emitting a light beam, having a third wavelength region selected independently of the first wavelength, to irradiate the object with the beam from said alignment light source, wherein a beam returned from the object is detected through said projection optical system, for measuring the position of the body.

3. An exposure apparatus according to claim 2, wherein the first wavelength region is between the second and the third wavelength regions.

4. An exposure apparatus according to claim 2, wherein each of said at least one optical elements include low reflectance layers, said layers have such characteristics that the reflectance of the first wavelength region is higher than that of either of the second and third wavelength regions.

5. An exposure apparatus according to claim 3, wherein, in said low reflectance layers, the reflectance of the first wavelength region is not less than 2% and the reflectance of either of the second and third wavelength regions is not more than 1%.

6. An exposure apparatus according to claim 2, wherein the second wavelength region is in one of a range of g-line and a range of i-line.

7. An exposure apparatus according to claim 2, wherein said exposure light source comprises one of a krypton-fluorine excimer laser and an argon-fluorine excimer laser.

8. An exposure apparatus according to claim 2, wherein the third wavelength region is in one of a helium-neon laser wavelength region and a wavelength region in the neighborhood of 610 nm.

9. An exposure apparatus according to claim 2, wherein the measuring beam has a wavelength region of a laser beam oscillating at a single frequency.

10. An exposure apparatus according to claim 9, wherein the laser oscillating at the single frequency comprises one of an argon laser and a yttrium-aluminum-garnet-double-wave laser.

11. A method of producing a device by projecting an original pattern onto an object to be exposed through a projection optical system having at least one optical element whose optical characteristics have been tested using a measuring beam having a first wavelength region, the optical elements having lower reflectance in a second wavelength region and in a third wavelength region, selected independently of the first wavelength region, lower than in the first wavelength region, said method comprising the steps of:

projecting an image of the original pattern onto the object, by irradiating a light beam having the second wavelength region, onto the original pattern and through the projection optical system, thereby exposing the object to produce the device; and measuring the position of the object, by irradiating a light beam having the third wavelength region, and detecting a beam returned from the object through the at least one optical element of the projection optical system.

12. A method according to claim 11, wherein the first wavelength region is between the second and third wavelength regions.

13. A method according to claim 11, wherein each of the at least one optical elements include low reflectance layers, the layers having such characteristics that the reflectance of the first wavelength region is higher than that of either of the second and third wavelength regions.

14. A method according to claim 13, wherein, in the low reflectance layers, the reflectance of the first wavelength region is not less than 2% and the reflectance of either of the second and third wavelength regions is not more than 1%.

15. A method according to claim 11, wherein the second wavelength region is in a range of one of g-line and i-line.

16. A method according to claim 11, wherein said projecting step comprises projecting a light beam from one of a krypton-fluorine excimer laser and an argon-fluorine excimer laser.

17. A method according to claim 11, wherein the third wavelength region is in one of a helium-neon laser wavelength region and a wavelength region in the neighborhood of 610 nm.

18. A method according to claim 11, wherein the measuring beam has a wavelength region of a laser beam oscillating at a single frequency.

19. A method according to claim 18, wherein the laser oscillating at the single frequency comprises one of an argon laser and a yttrium-aluminum-garnet-double-wave laser.

20. An exposure apparatus for producing devices, in which an original pattern is projected onto an object to be exposed, through a projection optical system, said exposure apparatus comprising:

a plurality of optical elements included in said projection optical system, the optical characteristics of each of the optical elements having been tested using a measuring beam having a first wavelength region, the optical elements having lower reflectance in a second wavelength region, selected independently of the first wavelength region, lower than in the first wavelength region; and an exposure light source for emitting a light beam, having the second wavelength region, to irradiate the original pattern with the beam from said exposure light source, so that an image pattern is projected onto the object, through the optical elements, thereby exposing the object to produce the device.

21. A method of producing a device by projecting an original pattern onto an object to be exposed through a projection optical system having a plurality of optical elements whose optical characteristics have been tested using a measuring beam having a first wavelength region, the optical elements having lower reflectance in a second wavelength region and in a third wavelength region, selected independently of the first wavelength region, lower than in the first wavelength region, said method comprising the steps of:

projecting an image of the original pattern onto the object, by irradiating a light beam having the second wavelength region, onto the original pattern and through the projection optical system, thereby exposing the object to produce the device; and measuring the position of the object, by irradiating a light beam having the third wavelength region, and detecting a beam returned from the object through the optical elements of the projection optical system.

22. An exposure apparatus for producing devices, in which an original pattern is projected onto an object to be exposed, through a projection optical system, said exposure apparatus comprising:

a plurality of optical elements included in said projection optical system, each optical element including a layer having a higher transmittance and lower reflectance in each of a second wavelength region and a third wavelength region than in a first wavelength region, the first wavelength region being longer than the second wavelength region and shorter than the third wavelength region, the optical characteristics of each optical element having been tested using a measuring beam having the first wavelength region;

an exposure light source for emitting a light beam having the second wavelength region to irradiate the original pattern with the beam from said exposure light source, so that an image of the pattern is projected onto the object through the plurality of optical elements, thereby exposing the object to produce the device; and an alignment light source for emitting a light beam having the third wavelength region to irradiate the object with the beam from said alignment light source, the position of the object being detected as the light beam is returned from the object through said projection optical system.

23. A method of producing a device by projecting an original pattern onto an object to be exposed through a projection optical system having a plurality of optical elements, each optical element including a layer having a higher transmittance and a lower reflectance in each of a second wavelength region and a third wavelength region than in a first wavelength region, said method comprising the steps of:

testing the optical characteristics of each optical element using a measuring beam having the first wavelength region, the first wavelength region being longer than the second wavelength region and shorter than the third wavelength region;

projecting an image of the original pattern onto the object by irradiating a light beam having the second wavelength region onto the original pattern and through the projection optical system, thereby exposing the object; and measuring the position of the object by irradiating a light beam having the third wavelength region and detecting a beam returned from the object through the plurality of optical elements of the projection optical system.

* * * * *

UNITED STATES PATENT AND TRADEMARK OFFICE
CERTIFICATE OF CORRECTION

PATENT NO. : 5,774,205

DATED : June 30, 1998

INVENTOR : RYUICHI SATO

It is certified that error appears in the above-identified patent and that said Letters Patent is hereby corrected as shown below:

ON THE COVER PAGE

IN THE TITLE, Item [54], "EXPOSURE AND METHOD" should read --EXPOSURE APPARATUS AND METHOD--.

IN THE FIGURE, in Element "1", "EXPORSURE" should read --EXPOSURE-- and "LIST" should read --LIGHT--; and
    In Element "2", "IMADIATION" should read --IRRADIATION--.

IN THE DRAWINGS

In FIG. 1, in Element "1", "EXPORSURE" should read --EXPOSURE-- and "LIST" should read --LIGHT--; and
    In Element "2", "IMADIATION" should read --IRRADIATION--.

UNITED STATES PATENT AND TRADEMARK OFFICE
CERTIFICATE OF CORRECTION

PATENT NO. : 5,774,205

DATED : June 30, 1998

INVENTOR : RYUICHI SATO

It is certified that error appears in the above-identified patent and that said Letters Patent is hereby corrected as shown below:

IN THE DISCLOSURE

COLUMN 4:

Line 5, "the producing" should read --producing the--.

Signed and Sealed this

Fifteenth Day of May, 2001

Attest:

NICHOLAS P. GODICI

Attesting Officer     Acting Director of the United States Patent and Trademark Office